(12) United States Patent
Yoshino et al.

(10) Patent No.: US 8,466,757 B2
(45) Date of Patent: Jun. 18, 2013

(54) MULTILAYER COMMON MODE FILTER

(75) Inventors: Makoto Yoshino, Tokyo (JP); Takuo Hattori, Tokyo (JP); Ryota Nakanishi, Tokyo (JP)

(73) Assignee: TDK Corporation, Tokyo (JP)

( * ) Notice: Subject to any disclaimer, the term of this patent is extended or adjusted under 35 U.S.C. 154(b) by 560 days.

(21) Appl. No.: 12/753,462

(22) Filed: Apr. 2, 2010

(65) Prior Publication Data
US 2010/0301966 A1 Dec. 2, 2010

(30) Foreign Application Priority Data
May 29, 2009 (JP) .................................. 2009-130582

(51) Int. Cl.
H03H 7/01 (2006.01)
H01F 5/00 (2006.01)
H01F 17/00 (2006.01)

(52) U.S. Cl.
USPC ........................... 333/185; 333/181; 336/200

(58) Field of Classification Search
USPC .................. 333/185, 181; 336/200, 212, 211, 336/232
See application file for complete search history.

(56) References Cited

U.S. PATENT DOCUMENTS

| | | | |
|---|---|---|---|
| 5,552,756 A | 9/1996 | Ushiro | |
| 5,850,682 A | 12/1998 | Ushiro | |
| 6,504,466 B1 | 1/2003 | Katsurada | |
| 6,917,274 B2 * | 7/2005 | Hong et al. | 336/200 |
| 7,375,609 B2 * | 5/2008 | Suzuki et al. | 336/200 |
| 2009/0243780 A1 * | 10/2009 | Inoue et al. | 336/200 |
| 2009/0295526 A1 | 12/2009 | Mikami et al. | |

FOREIGN PATENT DOCUMENTS

| | | |
|---|---|---|
| JP | B2 3158757 | 4/2001 |
| JP | B2 3582454 | 10/2004 |
| JP | A 2007-250832 | 9/2007 |
| JP | A 2008-258525 | 10/2008 |
| WO | WO 2007/111122 A1 | 10/2007 |

* cited by examiner

Primary Examiner — Ryan Johnson
(74) Attorney, Agent, or Firm — Oliff & Berridge, PLC

(57) ABSTRACT

A multilayer common mode filter is provided, which can inhibit cracks from occurring, while securing the magnetic coupling between coil conductors. Since magnetic layers are disposed in an inner region of spiral first and second coil conductors, the multilayer common mode filter can secure the magnetic coupling between the first and second coil conductors. In a columnar part including these magnetic layers, magnetic and nonmagnetic bodies are arranged alternately in the laminating direction, whereby the total volume of the magnetic layers in the inner region can be kept smaller than in the case where a magnetic layer penetrates through the inner region of the coil conductors. As a result, at the time of firing a matrix, the difference in the amount of shrinkage between the nonmagnetic and magnetic layers can be suppressed, so as to inhibit cracks from occurring at their interfaces.

6 Claims, 7 Drawing Sheets

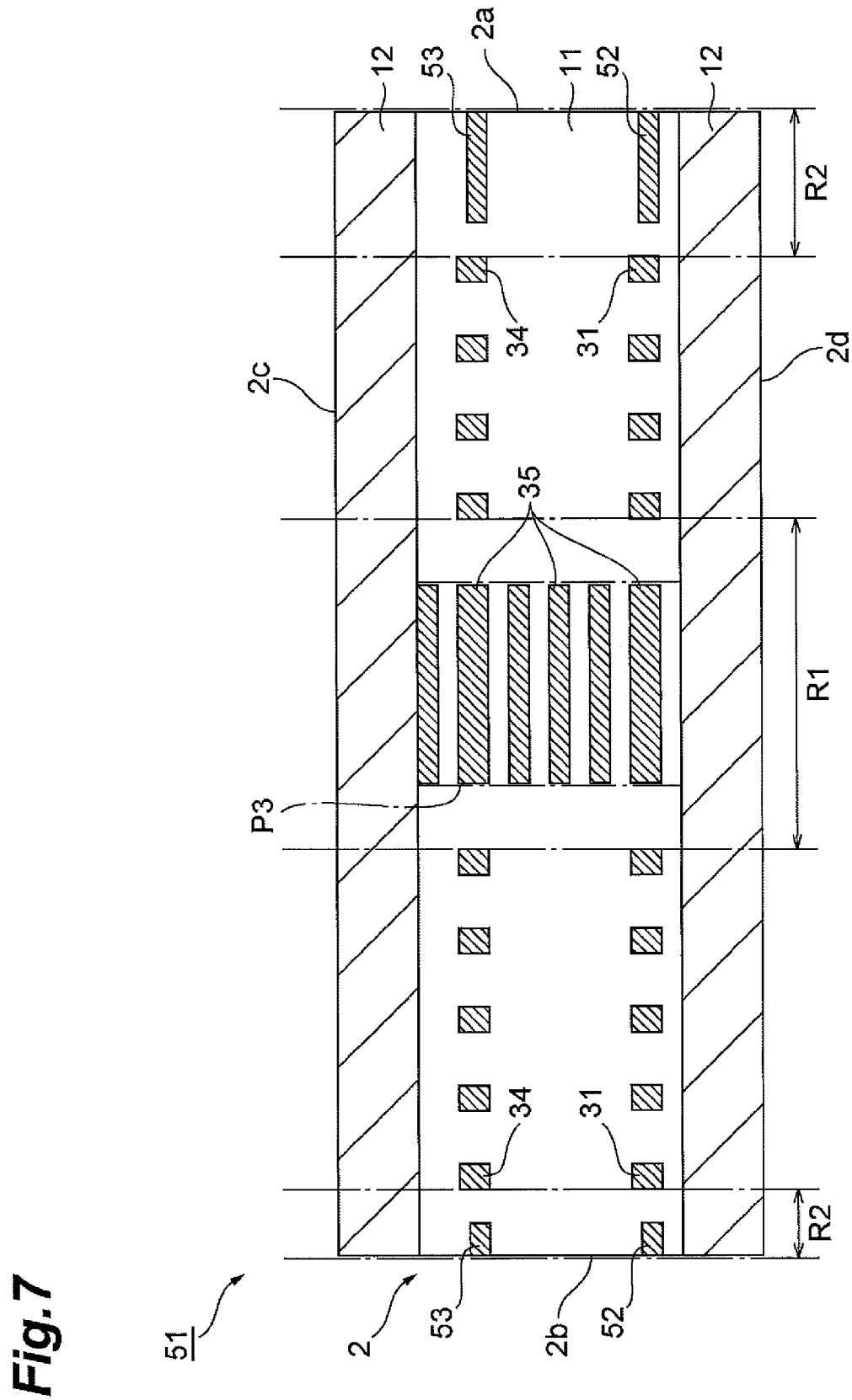

MULTILAYER COMMON MODE FILTER

BACKGROUND OF THE INVENTION

1. Field of the Invention

The present invention relates to a common mode filter of a multilayer type.

2. Related Background Art

An example of conventional multilayer common mode filters is one disclosed in Japanese Patent Application Laid-Open No. 2007-250832. This conventional common mode filter has a matrix in which a pair of nonmagnetic layers forming spiral coil conductors are held between a pair of magnetic layers, while a magnetic layer extending in the laminating direction penetrates through the center part of the coil conductors. This enhances the magnetic coupling between the coil conductors, thereby improving the capability of eliminating common mode noises.

SUMMARY OF THE INVENTION

Enhancing the magnetic coupling between the spiral coil conductors is a very important matter from the viewpoint of improving performances of common mode filters. In the above-mentioned conventional common mode filter, however, the volume of magnetic layers increases since a magnetic layer penetrates through the center part of the coil conductors. This has been problematic in that, at the time of firing the matrix, a stress caused by the difference in the amount of shrinkage between the nonmagnetic and magnetic layers is concentrated at their interfaces, thereby making it easier for cracks to occur. The conventional common mode filter has also been problematic in that a through hole formed in the center part of the nonmagnetic layers is provided with a conductive paste in order for a magnetic body to penetrate therethrough, whereby the volume of the magnetic layers is hard to control.

For solving the problems mentioned above, it is an object of the present invention to provide a multilayer common mode filter which can inhibit cracks from occurring, while securing the magnetic coupling between coil conductors.

For achieving the above-mentioned object, the multilayer common mode filter in accordance with the present invention comprises a matrix formed by laminating a plurality of nonmagnetic layers including a pair of nonmagnetic layers having respective surfaces formed with spiral coil conductors and a pair of magnetic layers holding the plurality of nonmagnetic layers therebetween; wherein the plurality of nonmagnetic layers have respective surfaces provided with magnetic layers located in an inner region of the coil conductors; and wherein the plurality of nonmagnetic layers are laminated such that a columnar part where magnetic and nonmagnetic bodies are arranged alternately in the laminating direction is formed in the inner region between the pair of magnetic layers.

Since the magnetic layers are disposed in the inner region of the spiral coil conductors, this multilayer common mode filter can secure the magnetic coupling between the coil conductors. In the columnar part including these magnetic layers, magnetic and nonmagnetic bodies are arranged alternately in the laminating direction, whereby the total volume of the magnetic layers in the inner region can be kept smaller than in the case where a magnetic layer penetrates through the inner region of the coil conductors. As a result, at the time of firing the matrix, the difference in the amount of shrinkage between the nonmagnetic and magnetic layers can be suppressed, so as to inhibit cracks from occurring at their interfaces. Without forming the nonmagnetic layers with a through hole, this multilayer common mode filter provides the respective surfaces of the nonmagnetic layers with magnetic layers. This makes it easier to control the volume of magnetic layers in the columnar part.

Preferably, the respective surfaces of the plurality of nonmagnetic layers are provided with depressions corresponding to the inner region, while the magnetic layers are provided in the depressions so as to be disposed unlevel with the coil conductors. In this case, the volume occupied by the nonmagnetic bodies in the columnar part decreases, thereby making it possible to further enhance the magnetic coupling between the coil conductors without changing the height of the multilayer common mode filter.

Preferably, the nonmagnetic layer formed with the coil conductor is further provided with a magnetic layer located in an outer region of the coil conductor. This allows the magnetic layer in the outer region to further enhance the magnetic coupling between the coil conductors.

Preferably, the coil conductor has a thickness greater than that of the magnetic layer located in the outer region. This can reduce the DC resistance of the multilayer common mode filter by securing a thickness of the coil conductor. Even when the coil conductor becomes thick, the magnetic layers located in the inner and outer regions also function as spacers, whereby voids can be inhibited from occurring within the matrix.

Preferably, the magnetic and nonmagnetic bodies in the columnar part have thicknesses equal to each other. This can more effectively suppress the difference in the amount of shrinkage between the magnetic and nonmagnetic bodies at the time of firing the matrix. This can also secure the magnetic coupling between the coil conductors more fully than in the case where the nonmagnetic bodies are thicker than the magnetic bodies.

Preferably, in the columnar part, the magnetic bodies have thicknesses equal to each other, while the nonmagnetic bodies have thicknesses equal to each other. This can more effectively suppress the difference in the amount of shrinkage between the magnetic and nonmagnetic bodies at the time of firing the matrix. This can also secure the magnetic coupling between the coil conductors more fully than in the case where the nonmagnetic bodies are thicker than the magnetic bodies.

As explained in the foregoing, the multilayer common mode filter in accordance with the present invention can inhibit cracks from occurring, while securing the magnetic coupling between the coil conductors.

BRIEF DESCRIPTION OF THE DRAWINGS

FIG. 7 is a sectional view of the matrix of the multilayer common mode filter illustrated in FIG. 6.

DESCRIPTION OF THE PREFERRED EMBODIMENTS

In the following, preferred embodiments of the multilayer common mode filter in accordance with the present invention will be explained in detail with reference to the drawings.

First Embodiment

Figure 1:
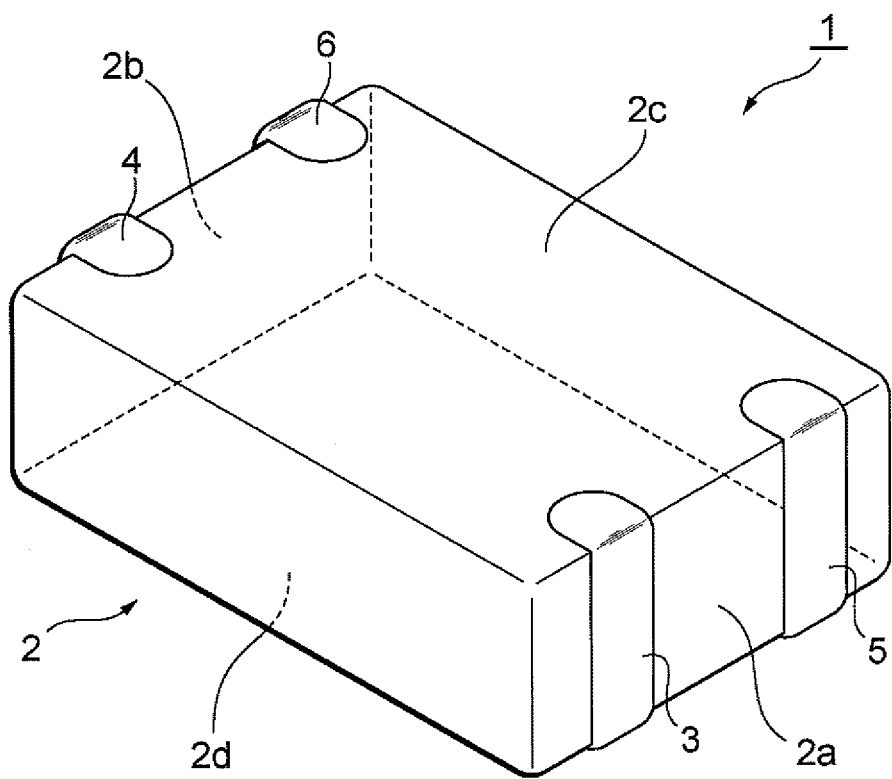
FIG. 1 is a perspective view illustrating the multilayer common mode filter in accordance with a first embodiment of the present invention.
Figure 2:
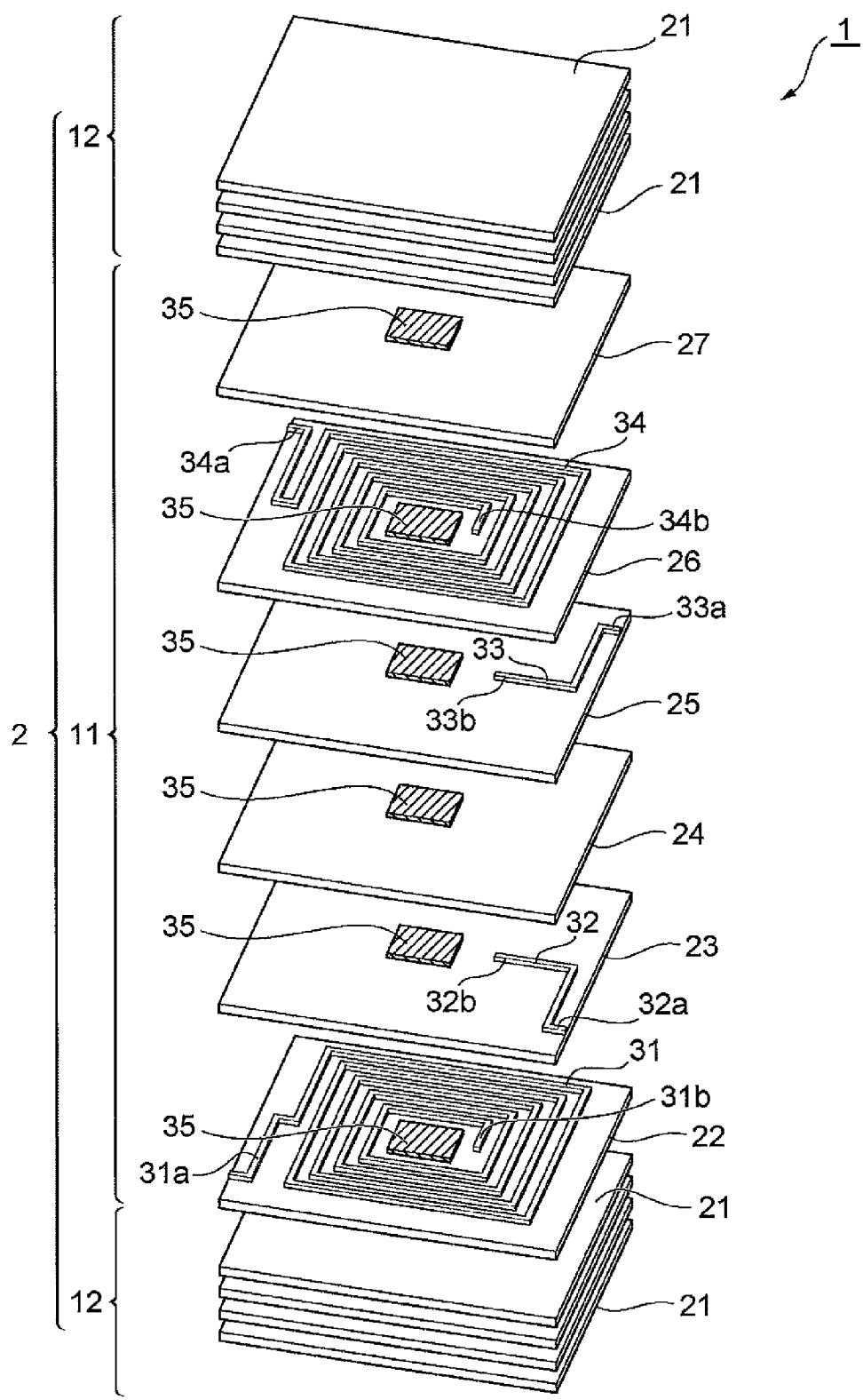
FIG. 2 is an exploded perspective view illustrating the structure of a matrix of the multilayer common mode filter illustrated in FIG. 1.
Figure 3:
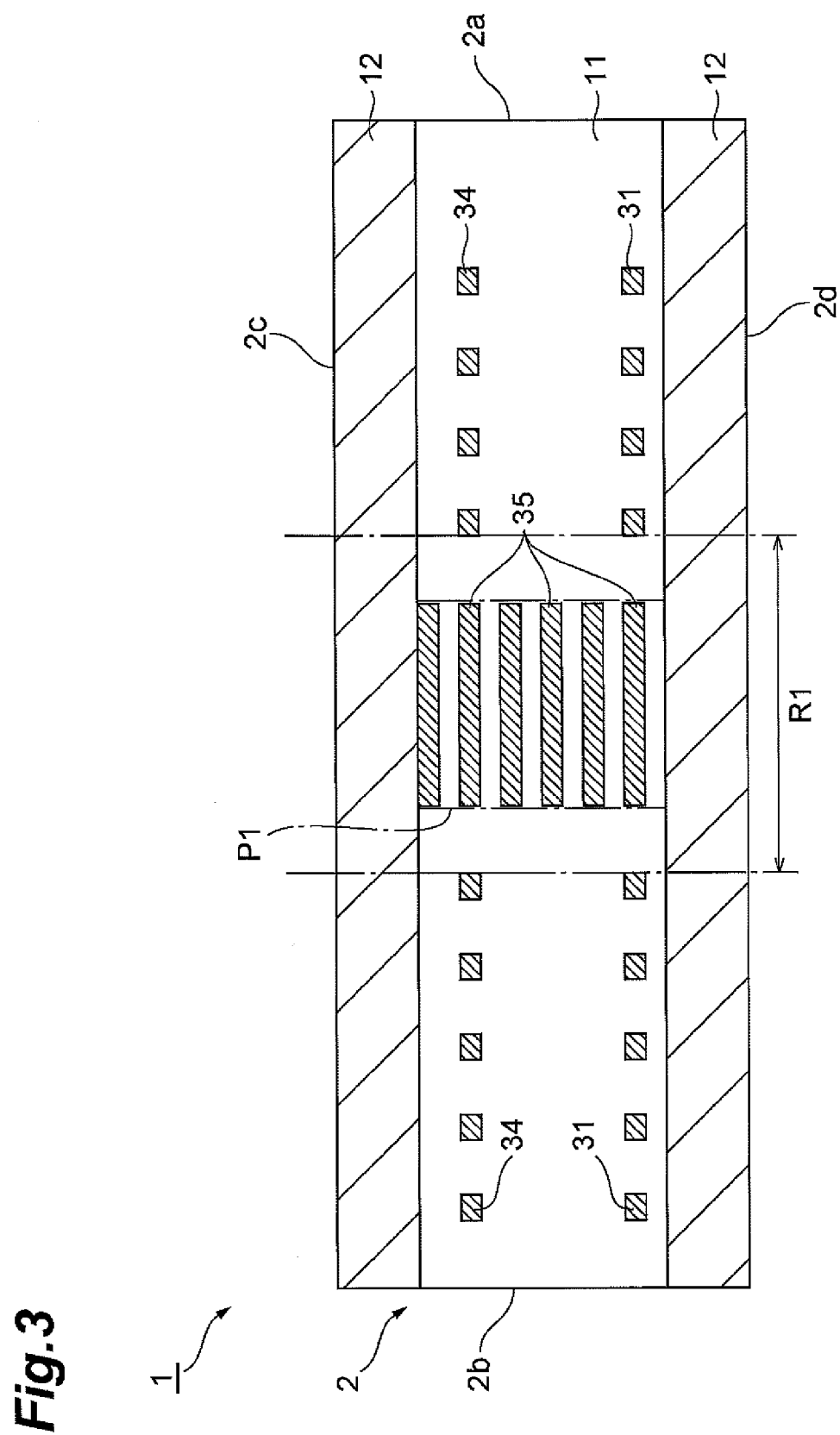
FIG. 3 is a sectional view of the matrix of the multilayer common mode filter illustrated in FIG. 2.

FIG. 1 is a perspective view illustrating the multilayer common mode filter in accordance with the first embodiment of the present invention. FIG. 2 is an exploded perspective view illustrating the structure of a matrix, while FIG. 3 is a sectional view of the matrix. As illustrated in FIG. 1, the multilayer common mode filter 1 comprises a substantially rectangular parallelepiped matrix 2 and outer electrodes 3 to 6 formed in both longitudinal end parts of the matrix 2.

The outer electrodes 3, 5 extend on one longitudinal end face 2a of the matrix 2 in the laminating direction of the matrix 2 and are separated from each other by a predetermined gap, while both end portions of the outer electrodes 3, 5 protrude over the upper face 2c and lower face 2d of the matrix 2. The outer electrodes 4, 6 extend on the other longitudinal end face 2b of the matrix 2 in the laminating direction of the matrix 2 and are separated from each other by a predetermined gap, while both end portions of the outer electrodes 4, 6 protrude over the upper face 2c and lower face 2d of the matrix 2.

As illustrated in FIGS. 2 and 3, the matrix 2 is a multilayer body formed by laminating a plurality of nonmagnetic layers 11 including a pair of nonmagnetic sheets 22, 26 having respective surfaces formed with spiral first and second coil conductors 31, 34 and a pair of magnetic layers 12, 12 holding the nonmagnetic layers 11 therebetween. The matrix 2 is formed by firing green sheets provided with conductor patterns, while individual layers constituting the nonmagnetic and magnetic layers 11, 12 in the actual multilayer common mode filter 1 are integrated to such an extent that they are indiscernible from each other.

Each of the magnetic layers 12, 12 is a multilayer body of a plurality of (4 in this embodiment) magnetic sheets 21. Each magnetic sheet 21 is formed such as to have a thickness of about 20 to 40 μm, for example, after firing. The magnetic layers 12, 12 are arranged such as to hold the nonmagnetic layers 11 from the upper and lower sides in the laminating direction, thereby constituting the upper face 2c and lower face 2d of the matrix 2.

The nonmagnetic layers 11 constitute a multilayer body of a plurality of (6 in this embodiment) nonmagnetic sheets. More specifically, the nonmagnetic layers 11 are constructed by laminating a nonmagnetic sheet 22 formed with the first coil conductor 31, a nonmagnetic sheet 23 formed with a first lead conductor 32, a first marginal nonmagnetic sheet 24, a nonmagnetic sheet 25 formed with a second lead conductor 33, a nonmagnetic sheet 26 formed with the second coil conductor 34, and a second marginal nonmagnetic sheet 27 in this order. Each of the nonmagnetic sheets 22 to 27 located between magnetic bodies 35 has a thickness of about 5 to 20 μm, for example.

The first coil conductor 31 is formed such as to have a thickness of about 5 to 20 μm, for example, on the surface of the nonmagnetic sheet 22 after firing. The first coil conductor 31 has an outer end part 31a drawn to the end face 2b of the matrix 2, so as to be connected to the outer electrode 4. The first coil conductor 31 has an inner end part 31b extending to the center side of the nonmagnetic sheet 22. The nonmagnetic sheet 22 is formed with a through hole conductor (not depicted) penetrating therethrough in the thickness direction at a position corresponding to the inner end part 31b of the first coil conductor 31.

As with the first coil conductor 31, the first lead conductor 32 is formed such as to have a thickness of about 5 to 20 μm, for example, on the surface of the nonmagnetic sheet 23 after firing. The first lead conductor 32 has an outer end part 32a drawn to the end face 2a of the matrix 2, so as to be connected to the outer electrode 3. The first lead conductor 32 has an inner end part 32b extending to a position corresponding to the through hole conductor in the nonmagnetic sheet 22. As a consequence, the first coil conductor 31 is connected to the outer electrode 3 through the first lead conductor 32.

The second coil conductor 34 is formed such as to have a thickness of about 5 to 20 μm, for example, on the surface of the nonmagnetic sheet 26 after firing. The second coil conductor 34 has an outer end part 34a drawn to the end face 2b of the matrix 2, so as to be connected to the outer electrode 6. The second coil conductor 34 has an inner end part 34b extending to the center side of the nonmagnetic sheet 26. The nonmagnetic sheet 26 is formed with a through hole conductor (not depicted) penetrating therethrough in the thickness direction at a position corresponding to the inner end part 34b of the second coil conductor 34.

As with the second coil conductor 34, the second lead conductor 33 is formed such as to have a thickness of about 5 to 20 μm, for example, on the surface of the nonmagnetic sheet 25 after firing. The second lead conductor 33 has an outer end part 33a drawn to the end face 2a of the matrix 2, so as to be connected to the outer electrode 5. The second lead conductor 33 has an inner end part 33b extending to a position corresponding to the through hole conductor in the nonmagnetic sheet 26. As a consequence, the second coil conductor 34 is connected to the outer electrode 5 through the second lead conductor 33.

The respective surfaces of the nonmagnetic sheets 22 to 27 are provided with the magnetic layers 35 located in an inner region R1 of the first and second coil conductors 31, 34. Each magnetic layer 35 is patterned into a rectangle by printing, for example, so as to have a thickness of about 3 to 15 μm, for example, after firing. In the nonmagnetic sheet 22 formed with the first coil conductor 31 and the nonmagnetic sheet 26 formed with the second coil conductor 34, a predetermined gap is provided between the magnetic layer 35 and the first and second coil conductors 31, 34, so as to keep them from coming into contact with each other.

The foregoing nonmagnetic sheets 22 to 27 are laminated in the matrix 2, so as to form a columnar part P1 in which the magnetic and nonmagnetic bodies are arranged alternately in the laminating direction is formed in the inner region R1 of the first and second coil conductors 31, 34 between a pair of magnetic layers 12, 12 as illustrated in FIG. 3. In this embodiment, each of the nonmagnetic sheets 22 to 24 has a thickness equal to that of the magnetic layer 35. Therefore, in the columnar part P1, the magnetic and nonmagnetic bodies are arranged alternately by equal thicknesses along the laminating direction, while the magnetic bodies are disposed on the same stages as the first and second coil conductors 31, 34.

A method of manufacturing the above-mentioned multilayer common mode filter 1 will now be explained.

First, magnetic green sheets for constructing the magnetic sheets 21 and nonmagnetic green sheets for constructing the nonmagnetic sheets 22 to 27 are prepared. The nonmagnetic green sheets are formed by applying a slurry made from a mixed powder of $Fe_2O_3$, ZnO, and CuO onto films by doctor blading, for example. Dielectric materials (e.g., a mixed powder of $TiO_2$, CuO, NiO, and MnCO) or oxide ceramic materials (e.g., $Al_2O_3$, $SiO_2$, $ZrO_2$, forsterite, steatite, cordierite, and their mixed powder) may be used in place of the mixed powder of $Fe_2O_3$, ZnO, and CuO.

The magnetic green sheets are formed by applying a slurry made from a powder of ferrite (e.g., Ni—Cu—Zn-based ferrite, Ni—Cu—Zn—Mg-based ferrite, Cu—Zn-based ferrite, and Ni—Cu-based ferrite) onto films by doctor blading, for example.

Next, through holes are formed by laser processing or the like at positions where through hole conductors are to be formed in predetermined nonmagnetic green sheets. After forming the through holes, conductor patterns corresponding to the first coil conductor 31, first lead conductor 32, second coil conductor 34, and second lead conductor 33 are formed in the nonmagnetic green sheets. Each conductor pattern is formed by screen-printing a conductor paste mainly composed of silver or nickel and then drying it, for example. The through holes are filled with the conductor paste when forming the conductor patterns.

After forming the conductor patterns, a pattern of a magnetic body corresponding to the magnetic layer 35 is formed by printing in a center region of each nonmagnetic green sheet, i.e., a region to become the inner region R1 of the first and second coil conductors 31, 34. A slurry made from a ferrite powder similar to that of the magnetic green sheets is used as the magnetic body, for example.

After printing the magnetic body, the green sheets are dried, laminated in sequence, bonded together under pressure, and then cut into chips. Thereafter, each chip is fired for a predetermined time at a temperature of 800° C. to 900° C., for example, so as to yield the matrix 2. Thereafter, the outer electrodes 3 to 6 are formed on the end faces 2a, 2b of the matrix 2. This completes the multilayer common mode filter 1 illustrated in FIGS. 1 to 3.

The outer electrodes 3 to 6 are formed by transferring an electrode paste mainly composed of silver, nickel, or copper to the end faces 2a, 2b of the matrix 2, then firing the electrode paste at about 700° C., and further subjecting it to electroplating. Cu/Ni/Sn, Ni/Sn, Ni/Au, Ni/Pd/Au, Ni/Pd/Ag, Ni/Ag, or the like can be used for the electroplating.

Since the magnetic layers 35 are disposed in the inner region R1 of the spiral first and second coil conductors 31, 34 as explained in the foregoing, the multilayer common mode filter 1 can secure the magnetic coupling between the first and second coil conductors 31, 34. Since the magnetic and nonmagnetic bodies are arranged alternately in the laminating direction in the columnar part P1 including the magnetic layers 35, the total volume of the magnetic layers 35 in the inner region R1 is kept smaller than in the case where the magnetic layer 35 penetrates through the inner region R1. As a result, at the time of firing the matrix 2, the difference in the amount of shrinkage between the nonmagnetic and magnetic layers 11, 35 is suppressed, whereby cracks can be inhibited from occurring at their interfaces.

Instead of forming a through hole in the nonmagnetic sheets 22 to 27, the respective surfaces of the nonmagnetic sheets 22 to 27 are provided with the magnetic layers 35 by printing or the like in the multilayer common mode filter 1. This simplifies the manufacturing process and makes it easier to control the volume of the magnetic layers 35 in the columnar part P1.

In the multilayer common mode filter 1, the magnetic layers 35 formed on the surfaces of the nonmagnetic sheets 22 to 27 have the same thicknesses as those of the nonmagnetic sheets 22 to 27, so that the magnetic and nonmagnetic bodies arranged alternately in the columnar part P1 are equal to each other. This can more effectively suppress the difference in the amount of shrinkage between the magnetic and nonmagnetic bodies. The magnetic coupling between the first and second coil conductors 31, 34 can be secured more fully than in the case where the nonmagnetic bodies are thicker than the magnetic bodies.

Second Embodiment

Figure 4:
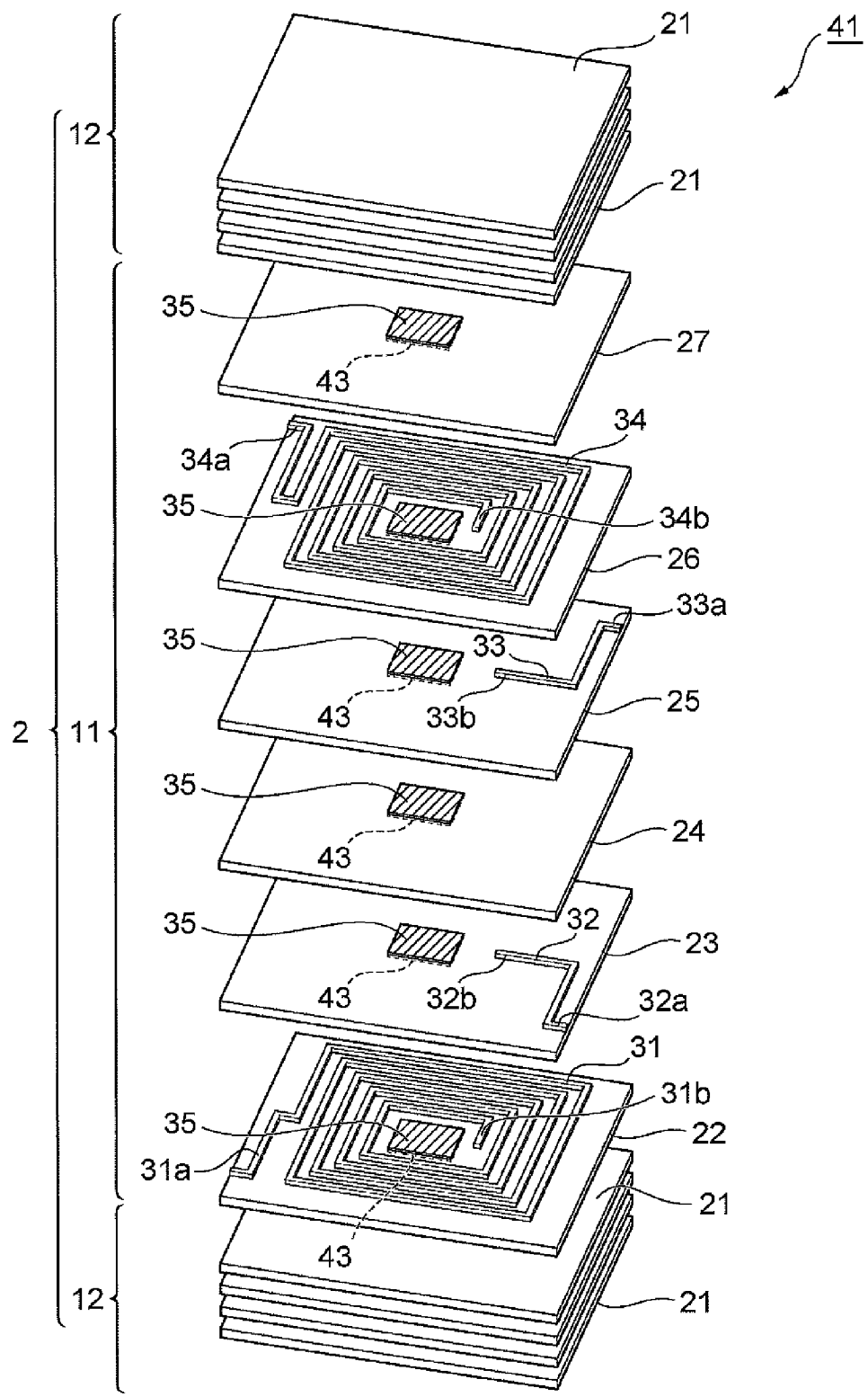
FIG. 4 is an exploded perspective view illustrating the structure of the matrix of the multilayer common mode filter in accordance with a second embodiment of the present invention.
Figure 5:
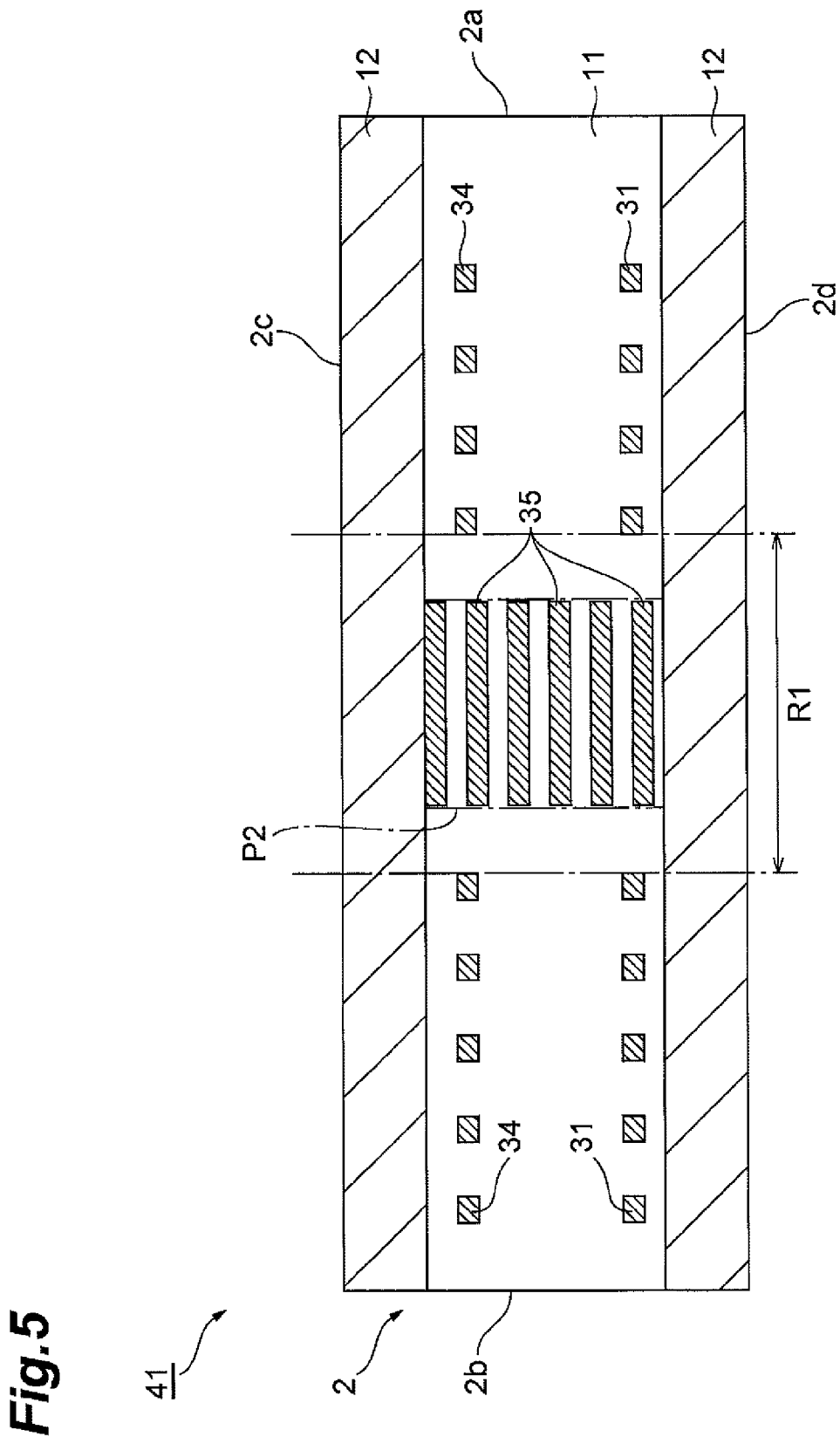
FIG. 5 is a sectional view of the matrix of the multilayer common mode filter illustrated in FIG. 4.

The second embodiment of the present invention will now be explained. FIG. 4 is an exploded perspective view illustrating the structure of the matrix in the multilayer common mode filter in accordance with the second embodiment of the present invention. FIG. 5 is a sectional view of the matrix.

As illustrated in FIGS. 4 and 5, the multilayer common mode filter 41 in accordance with the second embodiment is the same as that of the first embodiment except that the position of magnetic layers in its columnar part P2 differs from that in the columnar part P1 in the first embodiment. In this multilayer common mode filter 41, as illustrated in FIG. 4, rectangular depressions 43 are formed in the respective surfaces of the nonmagnetic sheets 22 to 27 so as to correspond to the inner region R1, while the magnetic layers 35 in the inner region R1 of the first and second coil conductors 31, 34 are disposed in these depressions 43.

The depressions 43 are formed by laser trimming of the nonmagnetic green sheets, for example, before firing. The depth of each depression 43 is set to about half of the thickness of the magnetic body 35. Laminating such nonmagnetic sheets 22 to 27 arranges the magnetic and nonmagnetic bodies alternately with each other by thicknesses equal to each other in the columnar part P2 of the matrix 2, while disposing the magnetic bodies unlevel with the first and second coil conductors 31, 34 as illustrated in FIG. 5.

Since the magnetic layers 35 are disposed in the inner region R1 of the spiral first and second coil conductors 31, 34, thus constructed multilayer common mode filter 41 can secure the magnetic coupling between the first and second coil conductors 31, 34 as in the first embodiment. Since the magnetic and nonmagnetic bodies are arranged alternately in the laminating direction in the columnar part P2 including the magnetic layers 35, the total volume of the magnetic layers 35 in the inner region R1 can be kept smaller than in the case where the magnetic layer 35 penetrates through the inner region R1. As a result, at the time of firing the matrix 2, the difference in the amount of shrinkage between the nonmagnetic and magnetic layers 11, 35 is suppressed, whereby cracks can be inhibited from occurring at their interfaces.

In the multilayer common mode filter 41, the depressions 43 are formed in the respective surfaces of the nonmagnetic sheets 22 to 27 so as to correspond to the inner region R1, whereby the magnetic layers 35 are disposed unlevel with the first and second coil conductors 31, 34. Such a structure reduces the volume occupied by the nonmagnetic bodies in the columnar part P2, thereby making it possible to further enhance the magnetic coupling between the first and second coil conductors 31, 34 without changing the height of the multilayer common mode filter 41.

Third Embodiment

Figure 6:
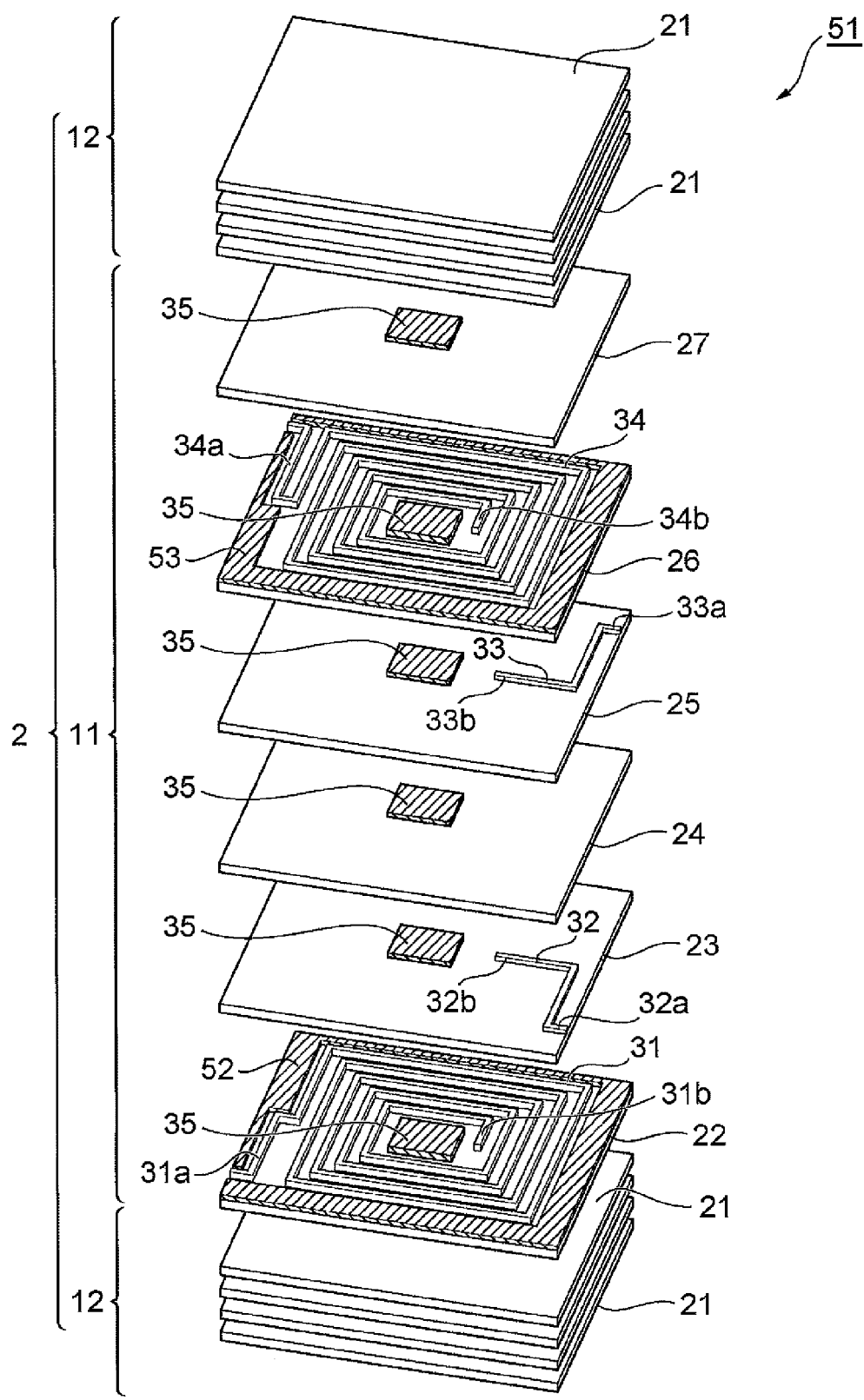
FIG. 6 is an exploded perspective view illustrating the structure of the matrix of the multilayer common mode filter in accordance with a third embodiment of the present invention.

The third embodiment of the present invention will now be explained. FIG. 6 is an exploded perspective view illustrating the structure of the matrix in the multilayer common mode filter in accordance with the third embodiment of the present invention. FIG. 7 is a sectional view of the matrix.

As illustrated in FIGS. 6 and 7, the multilayer common mode filter 51 in accordance with the third embodiment is the same as that of the first embodiment except for the structures of the nonmagnetic sheet 22 formed with the first coil conductor 31 and the nonmagnetic sheet 26 formed with the second coil conductor 34.

That is, in the third embodiment, magnetic layers 52, 53 located in an outer region R2 of the first and second coil conductors 31, 32 are further provided in the surfaces of the nonmagnetic sheets 22, 26. The magnetic layers 52, 53 are formed by printing, for example, in marginal parts of the nonmagnetic sheets 22, 26 excluding outer end parts 31a, 34a of the first and second coil conductors 31, 34. Each of the magnetic layers 52, 53 is formed such as to have a thickness of about 15 to 40 µm, for example, after firing.

In the nonmagnetic sheets 22, 26, each of the first coil conductor 31, the second coil conductor 34, and the magnetic layer 35 in the inner region R1 has a thickness of about 20 to 50 µm, for example, and is thicker than in the first embodiment. Therefore, a columnar part P3 is the same as the columnar part P1 of the first embodiment in that the magnetic and nonmagnetic bodies are arranged alternately along the laminating direction and that the magnetic bodies are disposed on the same stages as the first and second coil conductors 31, 34, but differs therefrom in that the magnetic bodies on the same stages as the first and second coil conductors 31, 34 are thicker than those on the other stages.

Since the magnetic layers 35 are disposed in the inner region R1 of the spiral first and second coil conductors 31, 34, thus constructed multilayer common mode filter 51 can secure the magnetic coupling between the first and second coil conductors 31, 34 as in the first embodiment. Since the magnetic and nonmagnetic bodies are arranged alternately in the laminating direction in the columnar part P3 including the magnetic layers 35, the total volume of the magnetic layers 35 in the inner region R1 can be kept smaller than in the case where the magnetic layer 35 penetrates through the inner region R1. As a result, at the time of firing the matrix 2, the difference in the amount of shrinkage between the nonmagnetic and magnetic layers 11, 35 is suppressed, whereby cracks can be inhibited from occurring at their interfaces.

In the multilayer common mode filter 51, the magnetic layers 52, 53 located in the outer region R2 of the first and second coil conductors 31, 34 are further provided in the nonmagnetic layers 22, 26 formed with the first and second coil conductors 31, 34, respectively. This makes it easier for magnetic fluxes to pass through the outside of the first and second coil conductors 31, 34 as well, thereby further enhancing the magnetic coupling between the first and second coil conductors 31, 34. From the viewpoint of the manufacturing process, it will be preferred if the magnetic layers 52, 53 in the outer region R2 are formed simultaneously with the magnetic layers 35 in the inner region R1 by printing or the like.

In the multilayer common mode filter 51, the first and second coil conductors 31, 34 are thicker than the magnetic layers 52, 53 located in the outer region R2. Thickening the first and second coil conductors 31, 34 as such can reduce the DC resistance of the multilayer common mode filter 51. Even when the first and second coil conductors 31, 34 are made thicker, the magnetic layers 52, 53 located in the outer region R2 also function as spacers, whereby voids can be inhibited from occurring within the matrix 2.

The present invention is not limited to the above-mentioned embodiments. For example, the magnetic layers 12 holding the nonmagnetic layers 11 therebetween may use a magnetic substrate instead of laminating a plurality of magnetic sheets 21. The magnetic layers 35 in the inner region R1 of the nonmagnetic sheets 22 to 27 may be formed by laminating magnetic sheets instead of printing.

What is claimed is:

1. A multilayer common mode filter comprising:
    a matrix formed by laminating a plurality of nonmagnetic layers including a pair of nonmagnetic layers having respective surfaces formed with spiral coil conductors and a pair of magnetic layers holding the plurality of nonmagnetic layers therebetween, and
    a plurality of magnetic body layers formed on the respective surfaces of the nonmagnetic layers in an inner region of the coil conductors, the coil conductors being formed on the same respective surfaces of the nonmagnetic layers as the magnetic body layers, wherein
    the plurality of nonmagnetic layers are laminated such that a columnar part where magnetic and nonmagnetic bodies are arranged alternately in the laminating direction is formed in the inner region between the pair of magnetic layers.

2. The multilayer common mode filter according to claim 1, wherein
    the respective surfaces of the plurality of nonmagnetic layers are provided with depressions corresponding to the inner region; and
    the magnetic body layers are provided in the depressions so as to be disposed unlevel with the coil conductors.

3. The multilayer common mode filter according to claim 1, wherein the nonmagnetic layer formed with the coil conductor is further provided with a magnetic layer located in an outer region of the coil conductor.

4. The multilayer common mode filter according to claim 3, wherein the coil conductor has a thickness greater than that of the magnetic layer located in the outer region.

5. The multilayer common mode filter according to claim 1, wherein the magnetic and nonmagnetic bodies in the columnar part have thicknesses equal to each other.

6. The multilayer common mode filter according to claim 1, wherein, in the columnar part, the magnetic bodies have thicknesses equal to each other, while the nonmagnetic bodies have thicknesses equal to each other.

* * * * *